(12) United States Patent
Yoneya et al.

(10) Patent No.: US 9,024,196 B2
(45) Date of Patent: May 5, 2015

(54) DIFFERENT SIGNAL TRANSMISSION LINE FOR PRINTED CIRCUIT BOARD

(75) Inventors: Masanao Yoneya, Hadano (JP);
Kazunori Nakajima, Sagamihara (JP);
Naohiro Sezaki, Ebina (JP); Kenji Kashiwagi, Minamiashigara (JP); Akio Ikeya, Hiratsuka (JP)

(73) Assignee: Hitachi, Ltd., Tokyo (JP)

( * ) Notice: Subject to any disclaimer, the term of this patent is extended or adjusted under 35 U.S.C. 154(b) by 424 days.

(21) Appl. No.: 12/985,765

(22) Filed: Jan. 6, 2011

(65) Prior Publication Data

US 2011/0203834 A1 Aug. 25, 2011

(30) Foreign Application Priority Data

Feb. 25, 2010 (JP) ................................. 2010-039560

(51) Int. Cl.
*H05K 1/00* (2006.01)
*H05K 1/02* (2006.01)

(52) U.S. Cl.
CPC ............ *H05K 1/0248* (2013.01); *H05K 1/0245* (2013.01); *H05K 1/025* (2013.01); *H05K 2201/09263* (2013.01); *H05K 2201/09727* (2013.01)

(58) Field of Classification Search
CPC .............................. H05K 1/0248; H05K 1/025
USPC ............................................... 174/250; 333/4
See application file for complete search history.

(56) References Cited

U.S. PATENT DOCUMENTS

| | | | | |
|---|---|---|---|---|
| 4,785,135 A * | 11/1988 | Ecker et al. | | 174/34 |
| 6,366,466 B1 * | 4/2002 | Leddige et al. | | 361/760 |
| 7,230,506 B2 * | 6/2007 | Beale et al. | | 333/5 |
| 7,282,649 B2 * | 10/2007 | Murata | | 174/261 |
| 7,414,201 B2 * | 8/2008 | Kanno et al. | | 174/117 F |
| 7,518,462 B2 * | 4/2009 | Kanno et al. | | 333/4 |
| 2012/0280766 A1 * | 11/2012 | Regnier | | 333/185 |

FOREIGN PATENT DOCUMENTS

JP 2008-153386 7/2008
JP 2008-244703 10/2008

* cited by examiner

*Primary Examiner* — William H Mayo, III
*Assistant Examiner* — Hiram E Gonzalez
(74) *Attorney, Agent, or Firm* — Brundidge & Stanger, P.C.

(57) ABSTRACT

There is provided a printed circuit board having a differential signal transmission line composed of non-skew-adjusting portions and skew-adjusting portions. The non-skew-adjusting portion consists of parallel conductive traces spaced apart by a spacing. The skew-adjusting portion consists of a pair of meander traces for the skew adjustment. The skew-adjusting portion include convex transmission line segments and concave transmission line segments. The convex transmission line segment has parallel traces having a differential trace pair spacing greater than the differential trace pair spacing in the non-skew-adjusting portion. The concave transmission line segment has parallel traces having a differential trace pair spacing smaller than the differential trace pair spacing in the non-skew-adjusting portion.

7 Claims, 8 Drawing Sheets

DIFFERENT SIGNAL TRANSMISSION LINE FOR PRINTED CIRCUIT BOARD

The present application claims priority from Japanese application JP-2010-039560 filed on Feb. 25, 2010, the content of which is hereby incorporated by reference into this application.

BACKGROUND OF THE INVENTION

The present invention relates to a printed circuit board (PCB) for transferring differential signals and, more particularly, to a printed circuit board in which matching of differential characteristic impedance is maintained.

As electronic information devices typified by computers have been operated at high rates in recent years, there arises a need for transferring higher-frequency digital signals between LSIs and within printed circuit boards. A currently widely accepted method of satisfying this requirement consists of preparing a pair of signal lines, passing signals of opposite polarities through the two lines, and recognizing a signal from the resulting potential difference. This is known as a differential signal transmission method.

In the differential signal transmission method, signals of opposite polarities are transmitted through a pair of signal lines. Therefore, if the two lines are different in electrical length (trace lengths represented based on delay time), a skew (phase deviation of signal waveform) is produced by a difference in propagation time between the differential signal pair at a receiving end even if they are opposite in polarity at a transmitting end. This generates unipolar noises. Therefore, in the differential signal transmission method, meander trace configurations are generally used. That is, one signal line of shorter electrical length out of the two signals providing a differential signal is meandered to match the two signals in terms of electrical length.

Figure 22:
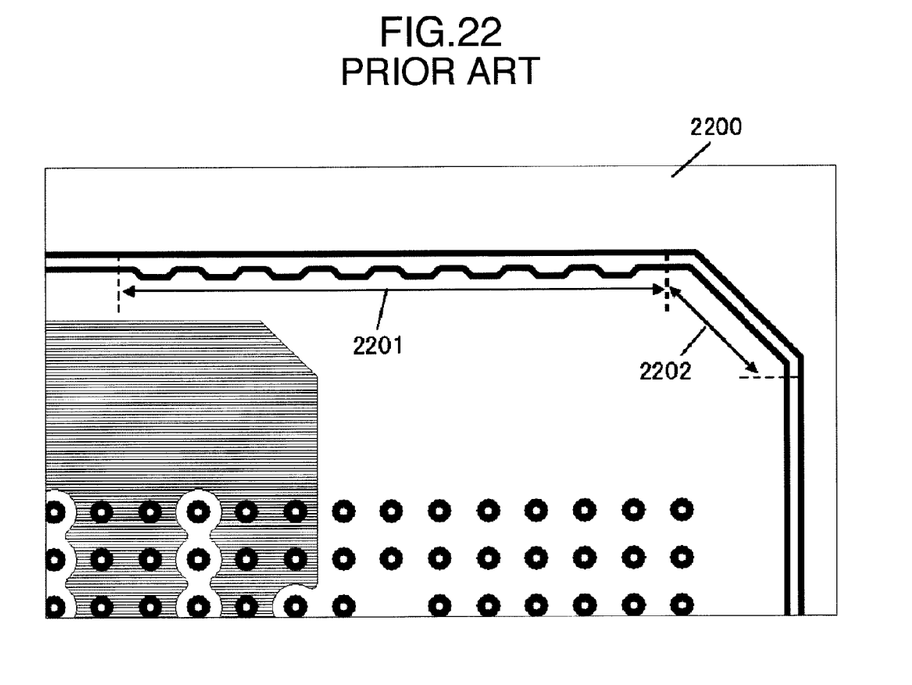
FIG. 22 is a view of a printed circuit board on which transmission lines of a meander trace configuration are formed.

An example in which a transmission line having a meander trace configuration is mounted on a printed circuit board 2200 is shown in FIG. 22. In an interval 2202 indicating a corner shown in the figure, the outer trace is longer than the inner trace, thus producing a skew. In the present example of mounting, the skew is adjusted by causing the traces within an interval 2201 to meander.

Figure 20:
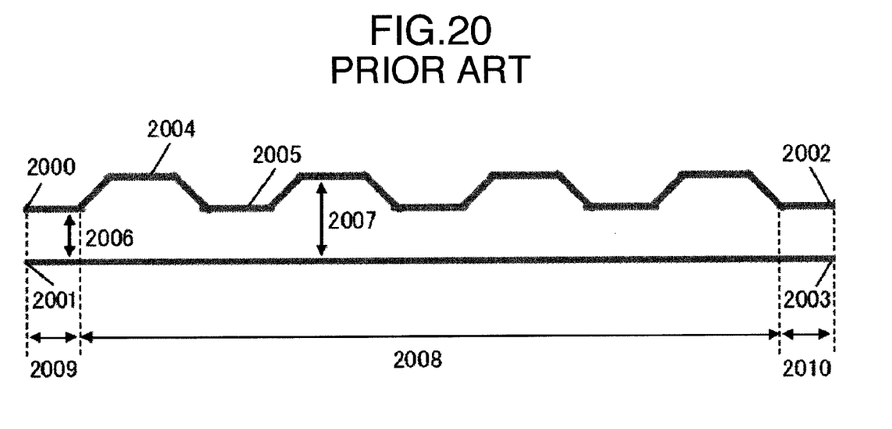
FIG. 20 is a front upper view of meander traces, particularly illustrating its structure.

The meander trace configuration is shown more particularly in FIG. 20. An interval 2008 represents a meander trace of a skew-adjusting portion, while indicated by 2009 and 2010 are non-skew-adjusting portions not involved in the skew adjustment. The length of a conductive trace subjected to the skew adjustment from a transmitting end 2000 to a receiving end 2002 is longer than the length of a conductive trace not subjected to a skew adjustment from a transmitting end 2001 to a receiving end 2003. The skew is thus adjusted by stretching one trace of the differential trace pair in this way.

With this conventional method of skew adjustment, however, a convex transmission line segment 2004 providing a wider trace pair spacing 2007 than in the non-skew-adjusting portions is spliced to a transmission line segment 2005 having a same trace pair spacing 2006 as in the non-skew-adjusting portions. These convex and non-convex transmission line segments are arranged at regular intervals. Consequently, there arises a problem that the differential characteristic impedances are mismatched.

Figure 21:
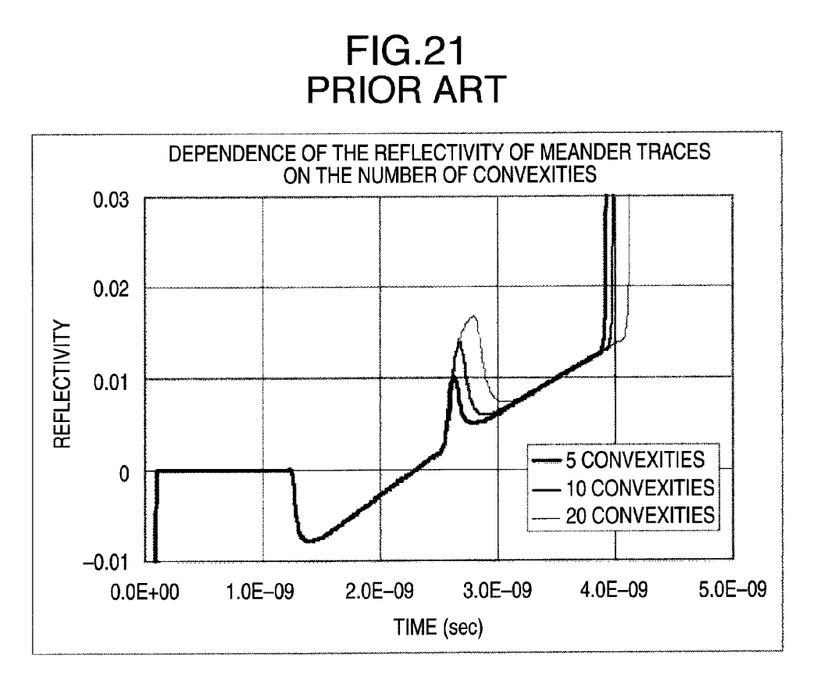
FIG. 21 is a graph representing the results of simulations of the reflectivity of signal at the meander traces.

FIG. 21 is a graph showing the results of an analysis of the reflectivity of a pulsed wave having a rise time (Tr) of 100 psec when it entered a differential trace pair of the conventional meander trace configuration of FIG. 20. The analysis was performed using a circuit simulator. In the present simulation, symmetric strip traces made of FR-4 substrate material that is currently widely used were assumed. The distance between a signal layer and a grounding layer was 0.142 mm. The differential trace pair spacing 2006 in each non-skew-adjusting portion was 0.167 mm. The differential trace pair spacing 2007 of the convex transmission line segment 2004 was 0.281 mm. The trace length of the convex transmission line segment 2004 was 0.5 mm. The trace length of each of the non-skew-adjusting portions 2009 and 2010 was 100 mm. In the illustrated example, 5, 10, 20 convex transmission line segments 2004 were formed in succession. As can be seen from the graph, when the skew has been adjusted, reflection was produced at the convex transmission line segments 2004. The reflectivity increased as 0.6%, 1.1%, and 1.2% when the number of the transmission line segments increased as 5, 10, and 20, respectively. That is, the reflectivity was increased with increasing the number of the convex transmission line segments. In this way, the skew adjustment of the conventional meander trace configuration is affected by the reflections due to the mismatch of the differential characteristic impedances. The effect becomes larger with increasing length of the skew-adjusting portion.

Furthermore, in the skew adjustment of the conventional meander trace configuration, the amount of skew adjustment per unit length of the skew-adjusting trace is small, and therefore, it is necessary to secure a large interconnect area for the skew adjustment.

As another well-known technique, JP-A-2008-244703 describes a method of forming vias having different shapes in differential trace pairs extending across a plurality of signal layers. JP-A-2008-153386 provides a method of adjusting skew by mounting capacitive stubs on conductive portions. In any of these methods, the mismatching of the differential characteristic impedances at electrical length-adjusting portions is unavoidable.

The effect of the mismatching of the differential characteristic impedances on the signal quality becomes more conspicuous with increasing rates at which signals are transmitted. Currently, there is a demand for a technique capable of solving both of the problems of the skew adjustment and the mismatching of the differential characteristic impedances.

SUMMARY OF THE INVENTION

It is an object of the present invention to provide a printed circuit board having a differential signal transmission line which makes a skew adjustment while maintaining the matching of differential characteristic impedances and which reduces quality deterioration of signal waveforms due to the reflections.

The present invention provides a printed circuit board having a differential signal transmission line including parallel conductive traces forming differential trace pairs (hereinafter referred to as non-skew-adjusting portions) and meander traces forming a differential trace pair for skew adjustment (hereinafter referred to as skew-adjusting portions). The skew-adjusting portions characteristically include two kinds of transmission line segments, convex transmission line segments which are made of parallel traces forming the differential trace pairs having a pair spacing greater than the pair spacing of the non-skew-adjusting portions, and the concave transmission line segments which are made of parallel traces forming the differential trace pairs having a pair spacing smaller than the pair spacing.

A first advantage of the invention is that the mismatching of the differential characteristic impedance between the skew-adjusting portions and the non-skew-adjusting portions is suppressed thereby to greatly reduce the signal reflections. In consequence, the deterioration of waveform quality due to the skew adjustment can be reduced.

A second advantage of the invention is that restrictions on the trace length in each skew adjusting interval and restrictions on the trace length of the whole skew-adjusting arrangement are alleviated because the differential characteristic impedances can be matched between the convex and concave intervals. Consequently, design restrictions are alleviated and this can contribute to an improvement in design quality and to shortening of design period.

A third advantage of the invention is that space saving of the interconnect area is achieved and this can suppress the manufacturing costs of printed circuit boards.

Other objects, features and advantages of the invention will become apparent from the following description of the embodiments of the invention taken in conjunction with the accompanying drawings.

DETAILED DESCRIPTION OF THE EMBODIMENTS

First Embodiment

Figure 1:
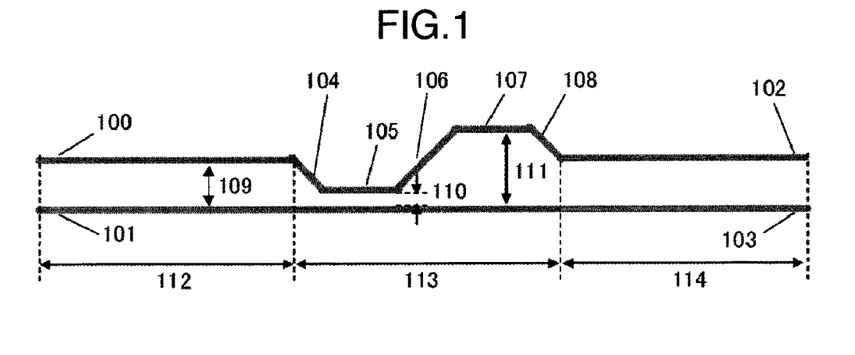
FIG. 1 is a front upper view illustrating a first embodiment of the present invention.

FIG. 1 is a front upper view illustrating a first embodiment of the present invention. A differential conductive trace pair on a printed circuit board is shown. Indicated by 112 and 114 are non-skew-adjusting portions which are not involved in a skew adjustment. Indicated by 113 is a skew-adjusting portion. The non-skew-adjusting portions have transmission lines 100 and 101 on a transmitter side. The non-skew-adjusting portions have transmission lines 102 and 103 on a receiver side. As shown, the transmission line 100 at the transmitting end is connected to the transmission line 102 at the receiving end by transmission line segments 104-108. Preferably, the bend angle for connecting the transmission lines or transmission line segments is equal to or less than 45 degrees. This also applies to embodiments (described later) other than the present embodiment. Spacings 109, 110, 111 indicate a spacing between the traces of the differential trace pair in the non-skew-adjusting portions 112 and 114, a spacing between the traces of the differential trace pair in a concave transmission line segment 105 and a spacing between the traces of the differential trace pair in a convex transmission line segment 107, respectively. Preferably, the spacing 111 is suppressed to or below the double of the spacing 109. This is also applied to embodiments described later. In this way, one interval of differential signal transmission line having convexities and concavities is constituted according to the first embodiment of the present invention.

As can be seen from FIG. 1, the trace length from the transmitting end 100 to the receiving end 102 of the transmission line is greater than the trace length from the transmitting end 101 to the receiving end 103 of the transmission line. By using the differential trace pair convexed and concaved in this way in accordance with the present invention, the length of one trace of the differential trace pair can be increased. Hence, the skew adjustment can be carried out.

Generally, the differential characteristic impedance of a differential trace pair varies according to the differential pair spacing, and therefore, the reflections of incident signals can be suppressed by adjusting the trace lengths of the convex transmission line segment 105 and concave transmission line segment 107 and the pair spacings 110, 111 of the differential trace pair, such that the average value of the differential characteristic impedance of one interval of the uneven differential trace path in the skew-adjusting portion 113 becomes equal to that of the non-skew-adjusting portions 112 and 114 and thus maintaining the impedance matching. Furthermore, the amount of skew adjustment per interval of the uneven differential trace pair increases compared with the skew adjustment using the conventional meander trace configuration.

In FIG. 1, an example is illustrated in which the convex transmission line segment 107 is placed behind the concave transmission line segment 105. The advantages of the present invention can be obtained if the concave transmission line segment 105 is placed behind the convex transmission line segment 107.

(Transmission Line (1) Employing the First Embodiment of the Invention)

Figure 2:
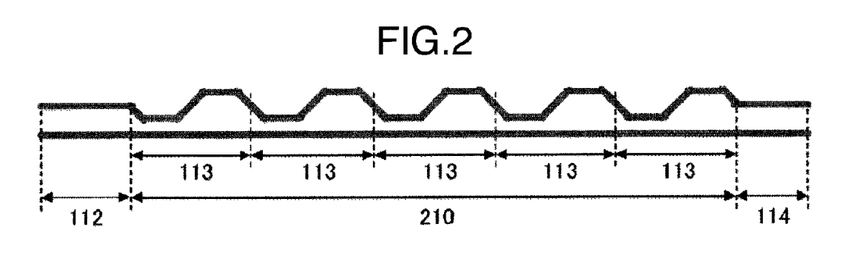
FIG. 2 is a front upper view illustrating a transmission line (1) to which the first embodiment of the invention is applied.

FIG. 2 is a front upper view illustrating a transmission line (1) to which the first embodiment is applied. The figure shows a differential trace pair on a printed circuit board. This differential trace pair is obtained by splicing together a plurality of the skew-adjusting portions 113 shown in FIG. 1. Indicated by 210 is a skew-adjusting interval.

When the skew adjustment is not completed in the first embodiment of the present invention, this modified embodiment may be used. In the first embodiment, the skew-adjusting portions and non-skew-adjusting portions are matched in the differential characteristic impedance and so if a plurality of the transmission line segments which are convexed and concaved are successively spliced together, the differential characteristic impedance of the skew-adjusting portions is kept equal to that of the non-skew-adjusting portions. This mitigates restrictions imposed on the design.

Figure 3:
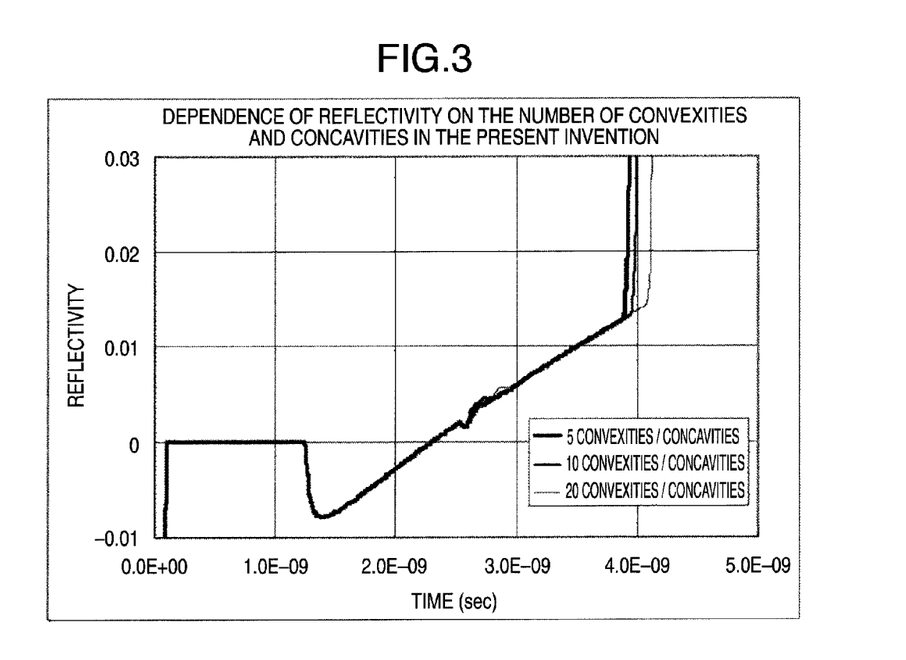
FIG. 3 is a graph representing the results of a first simulation of the reflectivities of signals in the first embodiment of the invention.

FIG. 3 represents results of a simulation of the reflectivity in a same geometry as in FIG. 2 in which a plurality of skew-adjusting portions of the configuration of FIG. 1 are successively spliced together. The simulation was carried out under a same condition as in FIG. 21. With respect to the its relationship with the differential trace models of FIGS. 1 and 20, the differential pair spacing 109 of the non-skew-adjusting portions 112 and 114 was set equal to the spacing 2006 and the differential pair spacing 111 of the convex transmission line segment 107 was set equal to the spacing 2007. The differential trace pair spacing 110 of the concave transmission line segment 105 of FIG. 1 was set to 0.115 mm, and the trace length of the transmission line segments 105 and 107 was set to 0.5 mm. The results indicate that, in the configurations of FIGS. 1 and 2, the reflectivity was kept to 0.1% or less at all times regardless of the number of uneven transmission line segments as different from FIG. 21 and thus the differential impedance of the skew-adjusting portions was matched to the differential impedance of the non-skew-adjusting portions.

Figure 4:
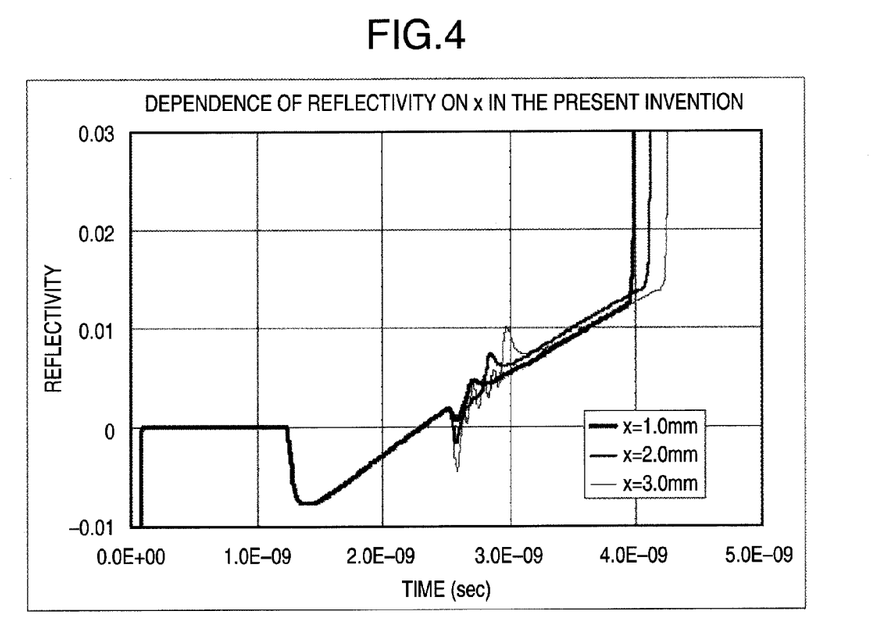
FIG. 4 is a graph representing the results of a second simulation of the reflectivities of signals in the first embodiment of the invention.

FIG. 4 represents the results of a simulation of five identical differential trace path segments of the first embodiment successively spliced together. The simulation was performed under a same conditions as in FIG. 3. Setting the trace length of each of the transmission line segments 105 and 107 as x, x was set to 1 mm, 2 mm, and 3 mm. It can be seen that as the value of x was increased, conspicuous reflections were observed. When the length x exceeded 2 mm, the ratio of the reflected signal to the incident signal was in excess of 0.3%. The results indicate that if it is desired to design to suppress the reflection to 0.3%, it is desirable to select the length x such that the following relation is satisfied:

$$x < \frac{1}{8} Tr \times v \tag{1}$$

where Tr is a rise time and v is a signal propagation velocity.

The simulations described so far reveal that this embodiment provides effective means enabling to alleviate the restrictions on the trace length of one interval of the skew-adjusting portion, the restrictions on the trace length of the whole skew-adjusting arrangement and to obtain the stable matching of the differential characteristic impedances, all at the same time.

(Transmission Line (2) Employing the First Embodiment)

Figure 5:
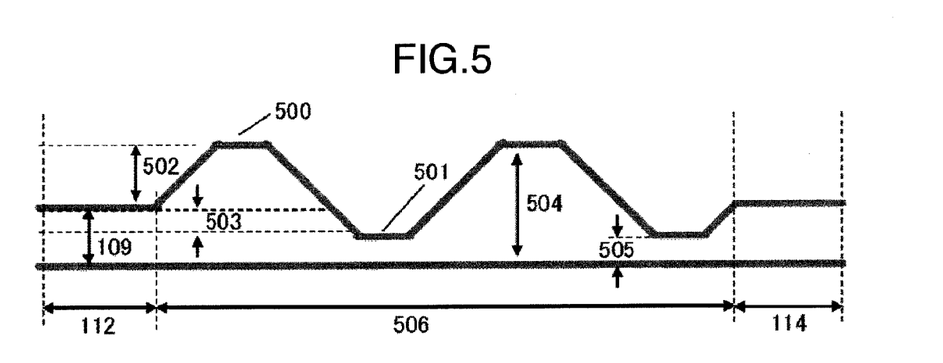
FIG. 5 is a front upper view illustrating a transmission line (2) to which the first embodiment of the invention is applied.

FIG. 5 is a front upper view illustrating a transmission line (2) to which the first embodiment is applied. The figure shows a differential trace pair on a printed circuit board. In this example, a convex transmission line segment 500 and a concave transmission line segment 501 are substantially identical in their trace lengths. A differential trace pair spacing 504 of the convex transmission line segment 500 is greater than the spacing 109. A differential trace pair spacing 505 of the concave transmission line segment 501 is smaller than the spacing 109. A distance 502 is the difference between the spacings 504 and 109. A distance 503 is the difference between the spacings 109 and 505.

In order to maintain the matching of the differential characteristic impedance between a skew-adjusting portion 506 and the non-skew-adjusting portions 112, 114, as a measure when the signal rise time is assumed to be 100 psec, it is desirable to design the transmission line so as to satisfy the following relationships, setting the spacings 505, 109, and 504 as S1, S, and S2, respectively.

$$0.5 < \frac{S1 \times S2}{S^2} < 2 \tag{2}$$

$$S1 < S < S2 < 2 \times S \tag{3}$$

(Transmission Line (3) Employing the First Embodiment of the Invention)

Figure 6:
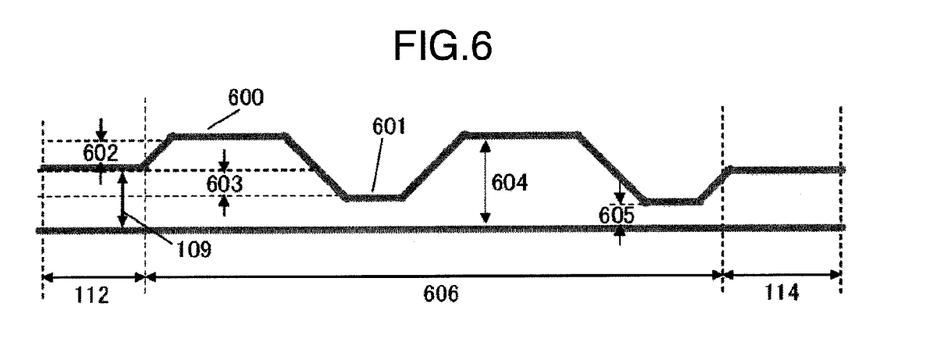
FIG. 6 is a front upper view illustrating a transmission line (3) to which the first embodiment of the invention is applied.

FIG. 6 is a front upper view of a transmission line (3) to which the first embodiment is applied. The figure shows a differential trace pair on a printed circuit board. In this example, a difference 602 between a differential trace pair spacing 604 of a convex transmission line segment 600 and the spacing 109 is substantially equal in absolute value to a difference 603 between a differential trace pair spacing 605 of a concave transmission line segment 601 and the spacing 109.

As a measure of maintaining the matching of the differential characteristic impedance between a skew-adjusting portion 606 and non-skew-adjusting portions 112 and 114, it is desirable to design the differential trace pair so as to satisfy the following relationship, $$0.5 \times \frac{x2}{x1} < \frac{Z - Z1}{Z2 - Z} < 1.5 \times \frac{x2}{x1} \tag{4}$$

where Z is a differential characteristic impedance of the non-skew-adjusting portions 112, 114, x1 the trace length of the concave transmission line segment 601, Z1 is a differential characteristic impedance of the segment 601, x2 is a trace length of the convex transmission line segment 600, and Z2 is a differential characteristic impedance of the segment 600.

Second Embodiment

Figure 7:
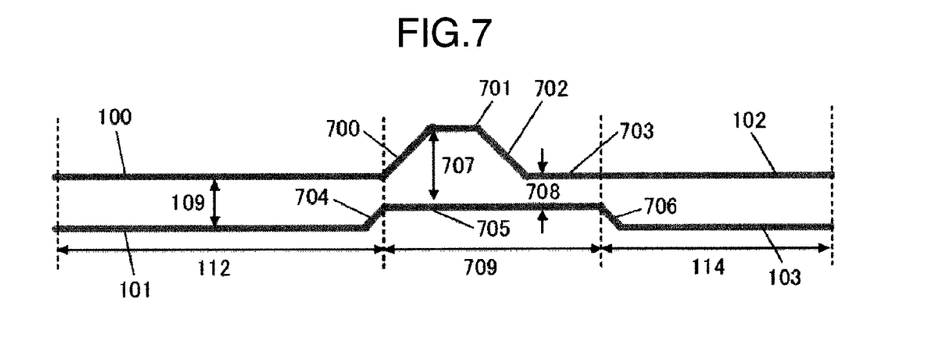
FIG. 7 is a front upper view illustrating a second embodiment of the invention.

FIG. 7 is a front upper view illustrating a second embodiment of the present invention. The figure shows a differential trace pair on a printed circuit board. Differential characteristic impedances are matched by bringing a trace for which a skew adjustment is not made closer to a trace for which a skew adjustment is made.

Indicated by 709 is a skew-adjusting portion. With respect to the trace for which a skew adjustment is made, a transmission line segment 100 at a transmitting end is connected to a transmission line segment 102 at a receiving end by transmission line segments 700-703. With respect to the trace for which a skew adjustment is not made, a transmission line segment 101 at the transmitting end is connected to a transmission line segment 103 at the receiving end by transmission line segments 704-706. A differential trace pair spacing 707 in the transmission line segment 701 is greater than the spacing 109. A differential trace pair spacing 708 in the transmission line segment 703 is smaller than the spacing 109. In this way, one interval of differential signal transmission line according to a second embodiment of the present invention is formed.

In this structure, the trace length of the transmission line segments 700 and 702 is made greater than the trace length of the transmission line segments 704 and 706. A skew adjustment can be made based on the difference. Generally, the differential characteristic impedance of a differential trace pair varies according to the trace pair spacing. Utilizing this characteristic, the trace length of the transmission line segments 701 and 703 and the differential trace pair spacings 707 and 708 are adjusted such that the average value of the differential characteristic impedance of one interval of differential trace path of the skew-adjusting portion 709 becomes equal to that of the non-skew-adjusting portions 112 and 114, and the matching of the differential characteristic impedances is maintained. Thus, the reflections of incident signals can be suppressed.

(Transmission Line (1) Employing the Second Embodiment of the Present Invention)

Figure 8:
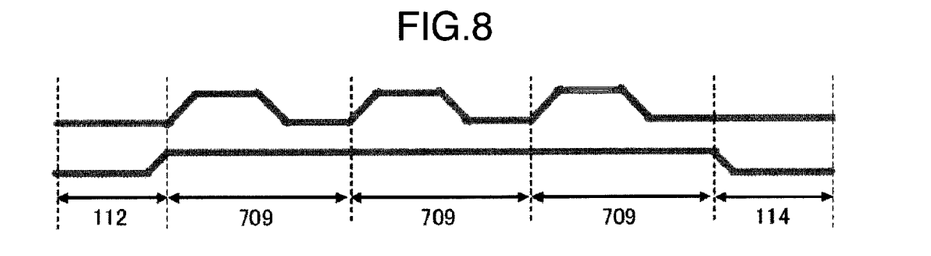
FIG. 8 is a front upper view illustrating a transmission line (1) to which the second embodiment of the invention is applied.

FIG. 8 is a front upper view illustrating a transmission line (1) to which the second embodiment of the invention is applied. The figure shows a differential trace pair on a printed circuit board. A plurality of the skew-adjusting portions 709, each corresponding to the skew-adjusting portion 709 of FIG. 7, are successively spliced together. In the second embodiment, the skew-adjusting portions 709 are matched to the non-skew-adjusting portions 112 and 114 in differential characteristic impedance. Therefore, if a plurality of the skew-adjusting portions are successively spliced together, the differential characteristic impedance of the whole skew-adjusting arrangement is matched to that of the non-skew-adjusting portions 112 and 114.

When the skew adjustment is not completed in the second embodiment of the present invention because the trace length is small, this modified embodiment provides effective means enabling to alleviate the restrictions on the trace length of the whole skew-adjusting arrangement and to obtain the matching of the differential characteristic impedances.

(Transmission Line (2) Employing the Second Embodiment of the Invention)

Figure 9:
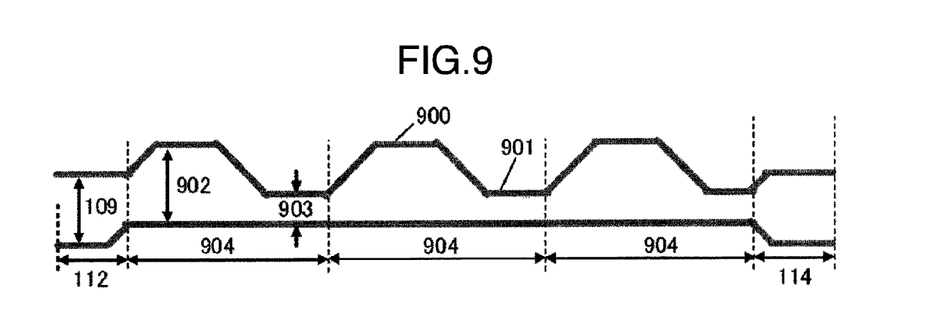
FIG. 9 is a front upper view illustrating a transmission line (2) to which the second embodiment of the invention is applied.

FIG. 9 is a front upper view illustrating a transmission line (2) to which the second embodiment of the present invention is applied. The figure shows a differential trace pair on a printed circuit board. In this example, a transmission line segment 900 and a transmission line segment 901 are substantially identical in their trace lengths. In the transmission line segment 900, a differential trace pair spacing 902 is greater than the spacing 109. In the transmission line segment 901, a differential trace pair spacing 903 is smaller than the spacing 109.

In order to maintain the matching of the differential characteristic impedance between a skew-adjusting portion 904 and the non-skew-adjusting portions 112 and 114, as a measure when the rise time of signals is assumed to be 100 psec, it is desirable to design the differential trace pair so as to satisfy the Eqs. (2) and (3), setting the spacings 903, 109, and 902 as S1, S, and S2, respectively.

(Transmission Line (3) Employing the Second Embodiment of the Invention)

Figure 10:
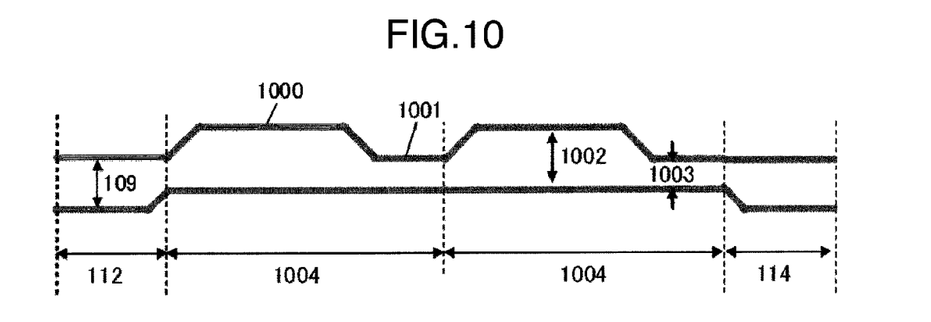
FIG. 10 is a front upper view illustrating a transmission line (3) to which the second embodiment of the invention is applied.

FIG. 10 is a front upper view illustrating a transmission line (3) to which the second embodiment of the invention is applied. The figure shows a differential trace pair on a printed circuit board. In this example, the difference between a differential trace pair spacing 1002 of a transmission line segment 1000 and the spacing 109 is substantially equal in absolute value to the difference between a differential pair spacing 1001 of a transmission line segment 1003 and the spacing 109. The spacing 1002 is greater than the spacing 109, while the spacing 1003 is smaller than the spacing 109.

If we set Z as the differential characteristic impedance of the non-skew-adjusting portions 112 and 114, a trace length and a differential characteristic impedance of the transmission line segment 1001 as x1 and Z1, respectively, and a trace length and a differential characteristic impedance of the transmission line segment 1000 as x2 and Z2, respectively, as a measure of maintaining the matching of the differential characteristic impedance between a skew-adjusting portion 1004 and non-skew-adjusting portions 112 and 114, it is desirable to design the differential trace pair so as to satisfy the relationship given by Eq. (4).

Third Embodiment

Figure 11:
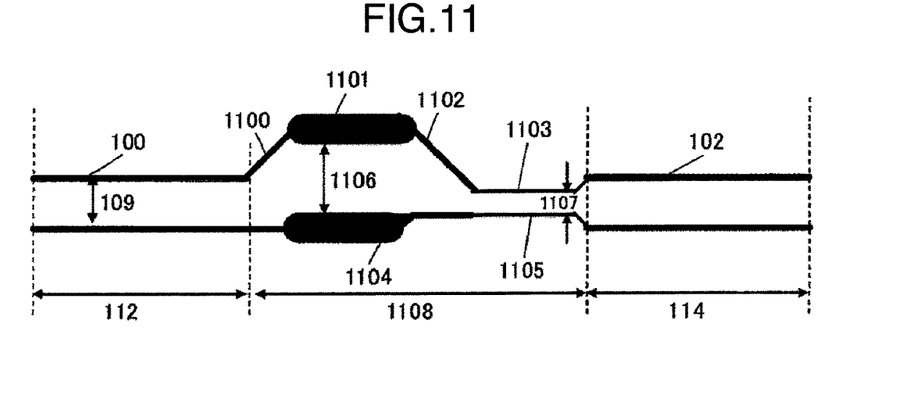
FIG. 11 is a front upper view illustrating a third embodiment of the invention.

FIG. 11 is a front upper view illustrating a third embodiment of the present invention. The figure shows a differential trace pair on a printed circuit board. A differential characteristic impedance matching between a skew-matching portion 1108 and non-skew-adjusting portions 112, 114 is maintained by making use of the characteristic that the differential characteristic impedance varies according to trace width. As shown, with respect to a trace for which a skew adjustment is made, the transmission line segment 100 at the transmitting end is connected to the transmission line segment 102 at the receiving end by transmission line segments 1100-1103. A differential trace pair spacing 1106 of the convex transmission line segment 1101 is greater than the spacing 109. A differential trace pair spacing 1107 of the concave transmission line segment 1103 is smaller than the spacing 109. In a skew-adjusting portion 1108, the trace width of the convex transmission line segment 1101 is greater than in the non-skew-adjusting portions 112 and 114. The trace width of the concave transmission line segment 1103 is smaller. With respect to the trace for which no skew adjustment is made, at least over the length of the trace portion parallel to the trace subjected to a skew adjustment, the width of the trace of a transmission line segment 1104 is matched to the width of the trace of the convex transmission line segment 1101, and a width of the trace of the transmission line segment 1105 is matched to the width of the trace of the concave transmission line segment 1103. Thus their single-ended characteristic impedances are matched together. In this way, one interval of differential signal transmission line according to the third embodiment of the invention is formed.

Because the matching of the differential characteristic impedance between the skew-adjusting portion 1108 and the non-skew-adjusting portions 112, 114 can be maintained by adjusting the trace lengths or widths of the convex transmission line segment 1101 and concave transmission line segment 1103 and the spacings 1106 and 1107, both the skew adjustment and the differential characteristic impedance matching can be accomplished also in the present embodiment.

(Transmission Line (1) Employing the Third Embodiment)

Figure 12:
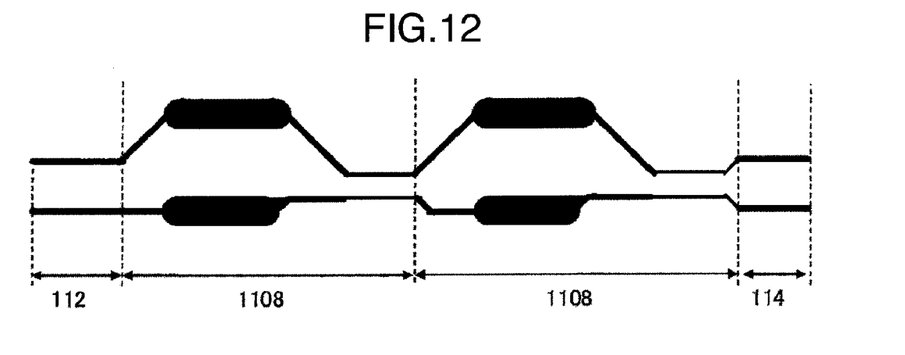
FIG. 12 is a front upper view illustrating a transmission line (1) to which the third embodiment of the invention is applied.

FIG. 12 is a front upper view illustrating a transmission line (1) to which the third embodiment of the invention is applied. The figure shows a differential trace pair on a printed circuit board. A plurality of the trace pairs, each according to the third embodiment, are successively spliced together. Since the skew-adjusting portions 1108 and the non-skew-adjusting portions 112, 114 are matched in their differential characteristic impedance in the third embodiment, if a plurality of the trace pairs are successively spliced together, the differential characteristic impedance of the whole skew-adjusting arrangement is kept matched to the non-skew-adjusting portions 112 and 114.

When the skew adjustment is not completed in the third embodiment of the present invention because the trace length is small, this modified embodiment provides effective means enabling to alleviate the restrictions on the trace length of the whole skew-adjusting matching and to obtain the matching of the differential characteristic impedances.

(Transmission Line (2) Employing the Third Embodiment)

Figure 13:
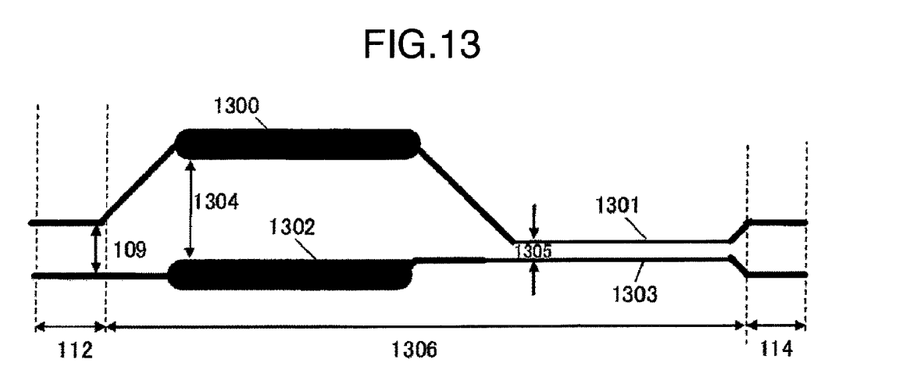
FIG. 13 is a front upper view illustrating a transmission line (2) to which the third embodiment of the invention is applied.

FIG. 13 is a front upper view illustrating a transmission line (2) to which the third embodiment of the invention is applied. The figure shows a differential trace pair on a printed circuit board. In this example, a convex transmission line segment 1300 and a concave transmission line segment 1301 are substantially identical in their trace length. With respect to the trace subjected to a skew adjustment, in the convex transmission line segment 1300, a differential trace pair spacing 1304 is greater than the spacing 109, and the trace width is greater than in the non-skew-adjusting portions 112 and 114. In the concave transmission line segment 1301, a differential trace pair spacing 1305 is smaller than the spacing 109, and the trace width is smaller than in the non-skew-adjusting portions 112 and 114. With respect to the trace for which no skew adjustment is made, at least over the length of the trace portion parallel to the trace subjected to the skew adjustment, the width of the trace of a transmission line segment 1302 is matched to the width of the trace of the convex transmission line segment 1300, and the width of the trace of a transmission line segment 1303 is matched to the width of the trace of the concave transmission line segment 1301. Thus their in single-ended characteristic impedances are matched.

Also, in this embodiment, the matching of the differential impedance to the non-skew-adjusting portions 112 and 114 can be maintained by adjusting the width of the trace of a skew-adjusting portion 1306 and the spacings 1304, 1305.

(Transmission Line (3) Employing the Third Embodiment)

Figure 14:
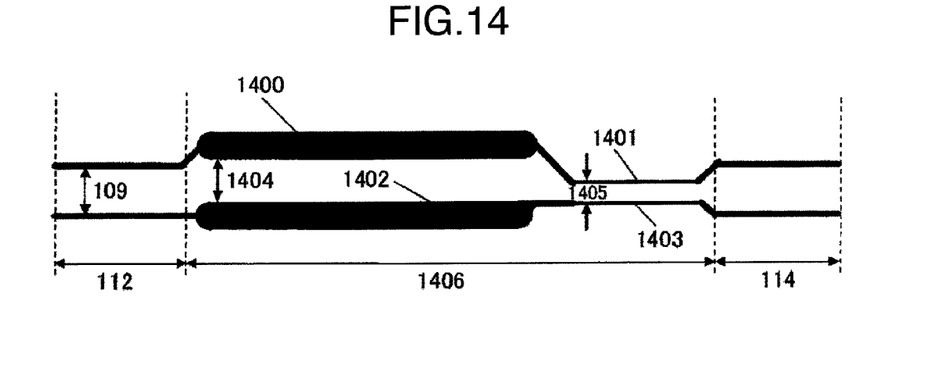
FIG. 14 is a front upper view illustrating a transmission line (3) to which the third embodiment of the invention is applied.

FIG. 14 is a front upper view illustrating a transmission line (3) to which the third embodiment of the invention is applied. The figure shows a differential trace pair on a printed circuit board. In this example, the difference between a differential trace pair spacing 1404 in a convex transmission line segment 1400 and the spacing 109 is substantially equal in absolute value to the difference between the spacing 109 and a differential trace pair spacing 1405 in a concave transmission line segment 1401. With respect to the trace subjected to a skew adjustment, in the convex transmission line segment 1400, a differential trace pair spacing 1404 is greater than the spacing 109, and the trace width is greater than in the non-skew-adjusting portions 112 and 114. In the concave transmission line segment 1401, the differential trace pair spacing 1405 is smaller than the spacing 109, and the trace width is smaller than in the non-skew-adjusting portions 112 and 114. With respect to the trace for which no skew adjustment is made, at least over the length of the trace portion parallel to the trace subjected to the skew adjustment, the width of the trace of a transmission line segment 1402 is matched to the width of the trace of the convex transmission line segment 1400, and the width of the trace of a transmission line segment 1403 is matched to the width of the trace of the concave transmission line segment 1401. Thus their single-ended characteristic impedances are matched.

Also, in this modified embodiment, the matching of the differential characteristic impedance with the non-skew-adjusting portions 112 and 114 can be maintained by adjusting the widths of the traces in the skew-adjusting portion 1406 and the trace lengths of the convex transmission line segment 1400 and concave transmission line segment 1401.

Fourth Embodiment

Figure 15:
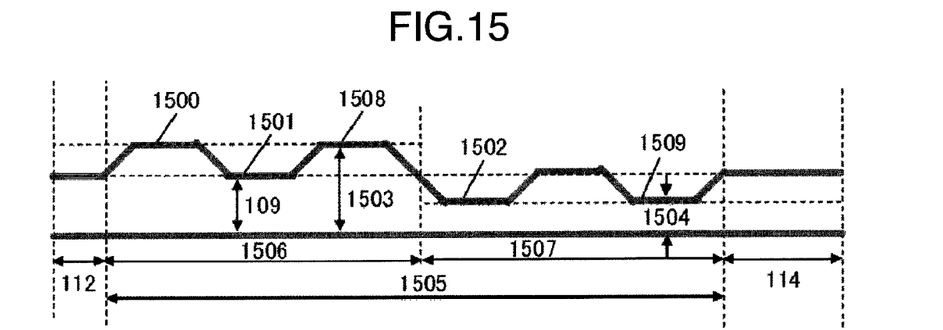
FIG. 15 is a front upper view illustrating a fourth embodiment of the invention.

FIG. 15 is a front upper view illustrating a fourth embodiment of the invention. The figure shows a differential trace pair on a printed circuit board. A skew-adjusting portion 1505 is composed of intervals 1506 and 1507. In the interval 1506, a convex transmission line segment 1500, a transmission line segment 1501, and a convex transmission line segment 1508 are spliced together. In the interval 1507, a concave transmission line 1502, a transmission line segment 1501, and a concave transmission line segment 1509 are spliced together. In the convex transmission line segments 1500 and 1508, a differential trace pair spacing 1503 is greater than the spacing 109. In the transmission line segments 1501, the differential trace pair spacing is equal to the spacing 109. In the concave transmission line segments 1502 and 1509, a differential trace pair spacing 1504 is smaller than the spacing 109. In this way, one interval of differential signal transmission line according to the fourth embodiment of the present invention is formed.

The differential characteristic impedance in the interval 1506 is higher than the non-skew-adjusting portions 112 and 114, while the differential characteristic impedance in the interval 1507 is lower. The trace lengths of the convex transmission line segments 1500, 1508 and of the concave transmission line segments 1502, 1509 and the spacings 1503 and 1504 are adjusted by making use of the above-described characteristic such that the average value of the differential characteristic impedance of the skew-adjusting portion 1505 becomes equal to that of the non-skew-adjusting portions 112 and 114. In this way, also in this modified embodiment, both the skew adjustment and the matching of differential characteristic impedances can be achieved.

However, it is necessary to design the differential trace pair in such a way that the trace lengths in the intervals 1506 and 1507 satisfy x in Eq. (1).

In the illustrated example, two convex transmission line segments and two concave transmission line segments are connected. The same advantages bring out if more than two concave transmission line segments and more than two concave transmission line segments continue, as long as the trace lengths 1506 and 1507 satisfy Eq. (1).

(Transmission Line (1) Employing the Fourth Embodiment)

Figure 16:
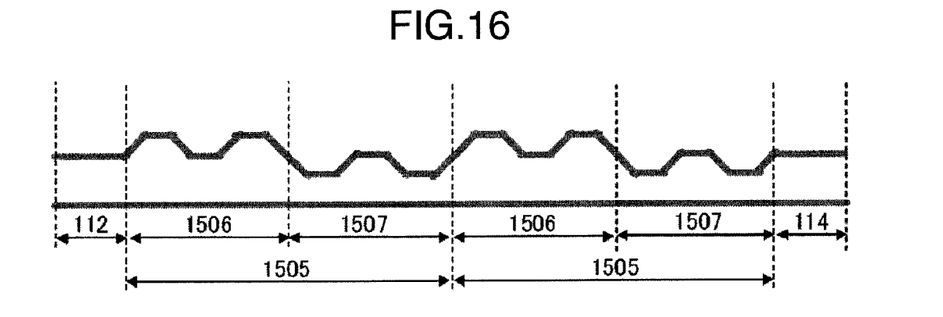
FIG. 16 is a front upper view illustrating a transmission line (1) to which a fourth embodiment of the invention is applied.

FIG. 16 is a front upper view illustrating a transmission line (1) to which the fourth embodiment is applied. The figure shows a differential trace pair on a printed circuit board. A plurality of the skew-adjusting portions 1505, each corresponding to the skew-adjusting portion 1505 of FIG. 15, are successively spliced together. In the fourth embodiment, a skew-adjusting portion 1505 and the non-skew-adjusting portions 112 and 114 are matched in their impedances and so if the skew-adjusting portions are successively spliced together, the differential characteristic impedance of the whole skew-adjusting arrangement is kept matched to the non-skew-adjusting portions 112 and 114.

In the fourth embodiment of the present invention, in a case where the trace length is small and a skew adjustment is not completed, this modified embodiment provides effective means enabling both the skew adjustment and the matching of differential characteristic impedances over a long distance.

(Transmission Line (2) Employing the Fourth Embodiment)

Figure 17:
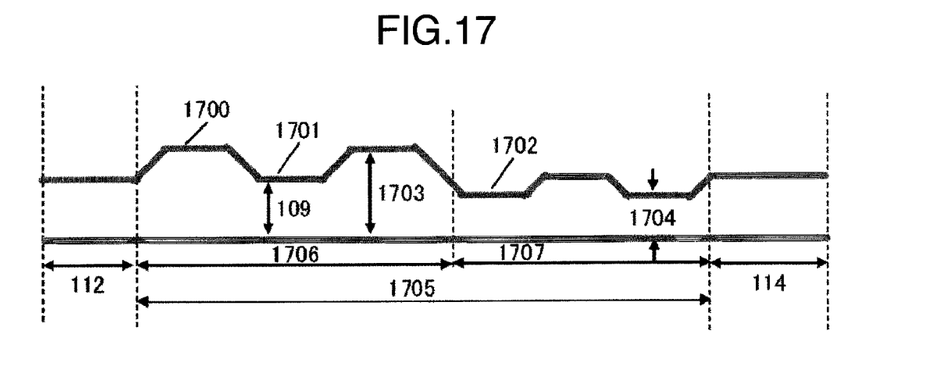
FIG. 17 is a front upper view illustrating a transmission line (2) to which the fourth embodiment of the invention is applied.

FIG. 17 is a front upper view illustrating a transmission line (2) to which the fourth embodiment of the invention is applied. The figure shows a differential trace pair on a printed circuit board. In this example, a convex transmission line segment 1700 and a concave transmission line segment 1702 are substantially identical in their trace length. In the convex transmission line segment 1700, a differential trace pair spacing 1703 is greater than the spacing 109. In the concave transmission line segment 1702, a differential trace pair spacing 1704 is smaller than the spacing 109. A transmission line segment 1701 has the trace pair spacing 109 that is the same as the trace pair spacing in the non-skew-adjusting portions 112 and 114. An interval 1706 has a higher differential characteristic impedance, while another interval 1707 has a lower differential characteristic impedance.

In order to maintain the matching of the differential characteristic impedance between a skew-adjusting portion 1705 and the non-skew-adjusting portions 112 and 114, as a measure when the rise time of signals is assumed to be 100 psec, it is desirable to design the differential trace pair so as to satisfy the Eqs. (2) and (3), setting the spacings 1704, 109, and 1703 as S1, S, and S2, respectively.

(Transmission Line (3) Employing the Fourth Embodiment)

Figure 18:
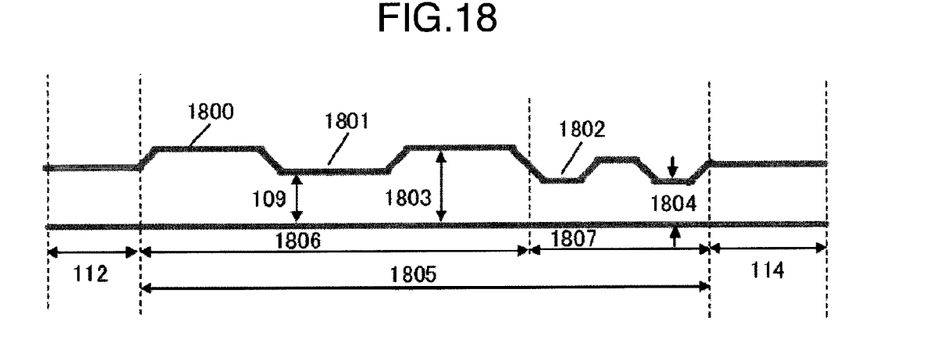
FIG. 18 is a front upper view illustrating a transmission line (3) to which the fourth embodiment of the invention is applied.

FIG. 18 is a front upper view illustrating a transmission line (3) to which the fourth embodiment of the invention is applied. The figure shows a differential trace pair on a printed circuit board. In this example, the difference between a differential trace pair spacing 1803 in a convex transmission line segment 1800 and the spacing 109 is substantially equal to the difference between the spacing 109 and a differential trace pair spacing 1804 in a concave transmission line segment 1802. A differential trace pair spacing 1803 in the convex transmission line segment 1800 is greater than the spacing 109. A differential trace pair spacing 1804 in the concave transmission line segment 1802 is smaller than the spacing 109. A transmission line segment 1801 has the differential trace pair spacing 109 identical with the differential trace pair spacing in the non-skew-adjusting portions. An interval 1806 has a higher differential characteristic impedance, while an interval 1807 has a lower differential characteristic impedance.

If we set the differential characteristic impedance of the non-skew-adjusting portions 112 and 114 as Z, a trace length of the concave transmission line segment 1802 as x1, and its differential characteristic impedance as Z1, a trace length and of the convex transmission line segment 1800 as x2, and its differential characteristic impedance Z2, as a measure of maintaining the matching of the differential characteristic impedance between a skew-adjusting portion 1805 and the non-skew-adjusting portions 112 and 114, it is desirable to design the differential trace pair so as to satisfy the relationship given by Eq. (4).

Fifth Embodiment

Figure 19:
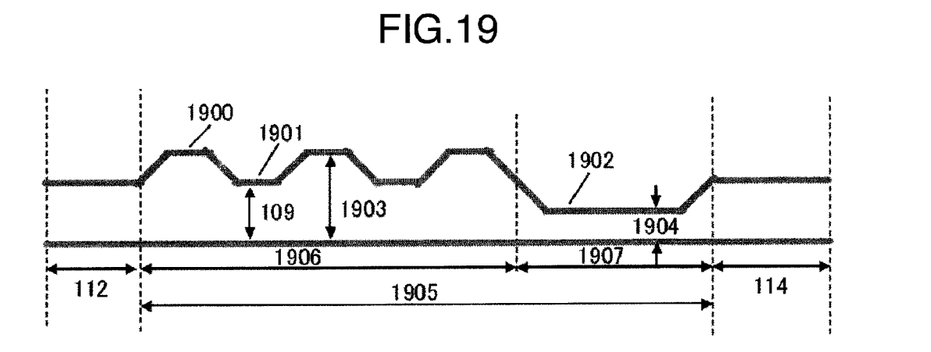
FIG. 19 is a front upper view illustrating a fifth embodiment of the invention.

FIG. 19 is a front upper view illustrating a fifth embodiment of the invention. The figure shows a differential trace pair on a printed circuit board. An interval 1906 of a meander trace configuration has an increased differential characteristic impedance. In order to lower the impedance, an interval 1907 having a concave transmission line segment 1902 is connected.

The differential trace pair spacing 1903 in each convex transmission line segment 1900 is greater than the spacing 109. A differential trace pair spacing 1904 in a concave transmission line segment 1902 is smaller than the spacing 109. A transmission line segment 1901 has the trace pair spacing 109 that is the same as the trace pair spacing of non-skew-adjusting portions 112 and 114.

A skew adjustment is made in an interval 1906 where the convex transmission line segments 1900 and the transmission line segments 1901 are alternately spliced together. The impedance increased by the skew adjustment is reduced by the interval 1907 where the concave transmission line segment 1902 is disposed. This maintains the matching of differential characteristic impedance between the non-skew-adjusting portions 112 and 114 and a skew-adjusting portion 1905. The structure described so far makes it possible to achieve both the skew adjustment and the reduction of signal reflections.

Note, however, that it is necessary to design in such a way that the trace lengths in the intervals 1906 and 1907 satisfy x in Eq. (1).

An example in which three convex transmission line segments are connected is shown in the figure. A transmission line having more than three convex transmission line segments can also be used as long as the trace lengths in the intervals 1906 and 1907 are smaller than x in Eq. (2).

Furthermore, the same advantages can be obtained by using the concave transmission line segments 1902 for the skew adjustment and using the convex transmission line segments 1900 for matching the lowered differential characteristic impedance, conversely to the configuration of FIG. 19, as long as the trace lengths in the intervals 1906 and 1907 satisfy Eq. (1).

All of the embodiments described so far can be implemented with printed circuit boards made of various materials. For example, signal layers and grounding layers are preferably made of metal conductors such as copper and gold. A dielectric layer (not shown) is formed between the signal layer and the grounding layer. The dielectric layer is preferably made of glass epoxy, polytetrafluoroethylene, polyimide, ceramics, or other material. Of course, the materials to be used are not limited to the aforementioned conductors and dielectric materials, and other materials may also be used. Strip traces and strip traces are not explicitly shown but the advantages of the present invention can be obtained from either structure.

A plurality of the above-described embodiments may be used in combination on one transmission line.

The conductive trace configurations according to these embodiments are similar to conductive trace configurations used on general printed circuit boards except that convex and concave transmission line segments are provided. Since these embodiments can be easily implemented by adjusting the differential trace pair spacing and the widths of the traces, they can be fabricated using general fabrication steps of printed circuit boards. Accordingly, the embodiments described so far can be accomplished without using any special steps which would normally result in high costs.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A printed circuit board having a differential signal transmission line comprising:
   parallel conductive traces forming a differential trace pair which forms a non-skew-adjusting portion making no skew adjustment; and meander traces forming a differential trace pair which forms a skew-adjusting portion making skew adjustment;
   wherein said skew-adjusting portion has two kinds of transmission line segments comprising a convex transmission line segment including a differential trace pair composed of parallel traces having a spacing greater than a spacing of the non-skew-adjusting portion and a concave transmission line segment including a differential trace pair composed of parallel traces having a spacing smaller than the spacing of the non-skew-adjusting portion; and wherein trace lengths of the parallel portions of said two kinds of transmission line segments having different differential trace pair spacings in said skew-adjusting portion are equal, and satisfy the following relationships:

$$0.5 < \frac{S1 \times S2}{S^2} < 2$$
$$S1 < S < S2 < 2 \times S$$

where S is a differential trace pair spacing of said non-skew-adjusting portion, S1 is a differential trace pair spacing of said concave transmission line segment, and S2 is a differential trace pair spacing of said convex transmission line segment.

2. A printed circuit board having a differential signal transmission line comprising:

parallel conductive traces forming a differential trace pair which forms a non-skew-adjusting portion making no skew adjustment; and meander traces forming a differential trace pair which forms a skew-adjusting portion making skew adjustment;

wherein said skew-adjusting portion has two kinds of transmission line segments comprising a convex transmission line segment including a differential trace pair composed of parallel traces having a spacing greater than a spacing of the non-skew-adjusting portion and a concave transmission line segment including a differential trace pair composed of parallel traces having a spacing smaller than the spacing of the non-skew-adjusting portion; and wherein in a case that a difference between the differential trace pair spacing of one kind of transmission line segment in said skew-adjusting portion and the differential trace pair spacing in said non-skew-adjusting portion is equal in absolute value to a difference between a differential trace pair spacing of the other kind of transmission line segment in said skew-adjusting portion and the differential trace pair spacing in said non-skew-adjusting portion, the following relation is satisfied:

$$0.5 \times \frac{x2}{x1} < \frac{Z-Z1}{Z2-Z} < 1.5 \times \frac{x2}{x1}$$

where Z is a differential characteristic impedance of said non-skew-adjusting portion, x1 is a trace length of the concave transmission line segment, Z1 is a differential characteristic impedance of the concave transmission line segment, x2 is a trace length of the convex transmission line segment, and Z2 is a differential characteristic impedance of the convex transmission line segment.

3. A printed circuit board having a differential signal transmission line comprising:

parallel conductive traces including a differential trace pair which forms a non-skew-adjusting portion making no skew adjustment; and meander traces forming a differential trace pair which forms a skew-adjusting portion making skew adjustment;

wherein one trace of the differential trace pair of the skew-adjusting portion has a plurality of convex transmission line segments and linear transmission line segments successively arranged; and the other trace of the differential trace pair of the skew-adjusting portion is composed of a single convex transmission line segment that spans the length of the skew-adjusting portion of the differential trace pair; and wherein in the skew-adjusting portion:

the spacing between one of the convex transmission line segments of the one trace of the differential trace pair and the convex transmission line segment of the other trace of the differential trace pair is greater than the spacing of the differential trace pair of the non-skew-adjusting portion; and the spacing between one of the linear transmission line segments of the one trace of the differential trace pair and the convex transmission line segment of the other trace of the differential trace pair is less than the spacing of the differential trace pair of the non-skew-adjusting portion.

4. A printed circuit board having a differential signal transmission line comprising:

parallel conductive traces forming a differential trace pair which forms a non-skew-adjusting portion making no skew adjustment; and meander traces forming a differential trace pair which forms a skew-adjusting portion making skew adjustment;

wherein said skew-adjusting portion has two kinds of transmission line segments comprising a convex transmission line segment including a differential trace pair composed of parallel traces having a spacing greater than a spacing of the non-skew-adjusting portion and a concave transmission line segment including a differential trace pair composed of parallel traces having a spacing smaller than the spacing of the non-skew-adjusting portion;

wherein a trace width of the differential trace pair of the convex transmission line segment in said skew-adjusting portion is made wider than a trace width of the differential trace pair of the concave transmission line segment; and wherein trace lengths of the parallel portions of said two kinds of transmission line segments having different differential trace pair spacings in said skew-adjusting portion are equal, and satisfy the following relationships:

$$0.5 < \frac{S1 \times S2}{S^2} < 2$$
$$S1 < S < S2 < 2 \times S$$

where S is a differential trace pair spacing of said non-skew-adjusting portion, S1 is a differential trace pair spacing of said concave transmission line segment, and S2 is a differential trace pair spacing of said convex transmission line segment.

5. A printed circuit board having a differential signal transmission line comprising:

parallel conductive traces forming a differential trace pair which forms a non-skew-adjusting portion making no skew adjustment; and meander traces forming a differential trace pair which forms a skew-adjusting portion making skew adjustment;

wherein said skew-adjusting portion has two kinds of transmission line segments comprising a convex transmission line segment including a differential trace pair composed of parallel traces having a spacing greater than a spacing of the non-skew-adjusting portion and a concave transmission line segment including a differential trace pair composed of parallel traces having a spacing smaller than the spacing of the non-skew-adjusting portion;

wherein a trace width of the differential trace pair of the convex transmission line segment in said skew-adjusting portion is made wider than a trace width of the differential trace pair of the concave transmission line segment; and wherein in a case that a difference between the differential trace pair spacing of one kind of transmission line segment in said skew-adjusting portion and the differential trace pair spacing in said non-skew-adjusting portion is equal in absolute value to a difference between a differential trace pair spacing of the other kind of transmission line segment in said skew-adjusting portion and the differential trace pair spacing in said non-skew-adjusting portion, the following relation is satisfied:

$$0.5 \times \frac{x2}{x1} < \frac{Z - Z1}{Z2 - Z} < 1.5 \times \frac{x2}{x1}$$

where Z is a differential characteristic impedance of said non-skew-adjusting portion, x1 is a trace length of the concave transmission line segment, Z1 is a differential characteristic impedance of the concave transmission line segment, x2 is a trace length of the convex transmission line segment, and Z2 is a differential characteristic impedance of the convex transmission line segment.

6. A printed circuit board having a differential signal transmission line comprising:

parallel conductive traces forming a differential trace pair which forms a non-skew-adjusting portion making no skew adjustment; and meander traces forming a differential trace pair which forms a skew-adjusting portion making skew adjustment;

wherein said skew-adjusting portion has two kinds of transmission line segments comprising a convex transmission line segment including a differential trace pair composed of parallel traces having a spacing greater than a spacing of the non-skew-adjusting portion and a concave transmission line segment including a differential trace pair composed of parallel traces having a spacing smaller than the spacing of the non-skew-adjusting portion;

wherein a transmission line segment having a differential trace pair spacing identical to the differential trace pair spacing in the non-skew-adjusting portion is disposed between said convex transmission line segments;

wherein the transmission line segment having a differential trace pair spacing identical to the differential trace pair spacing in the non-skew-adjusting portion is disposed between said concave transmission line segments; and wherein trace lengths of the parallel portions of said two kinds of transmission line segments having different differential trace pair spacings in said skew-adjusting portion are equal, and satisfy the following relationships:

$$0.5 < \frac{S1 \times S2}{S^2} < 2$$
$$S1 < S < S2 < 2 \times S$$

where S is a differential trace pair spacing of said non-skew-adjusting portion, S1 is a differential trace pair spacing of said concave transmission line segment, and S2 is a differential trace pair spacing of said convex transmission line segment.

7. A printed circuit board having a differential signal transmission line comprising:

parallel conductive traces forming a differential trace pair which forms a non-skew-adjusting portion making no skew adjustment; and meander traces forming a differential trace pair which forms a skew-adjusting portion making skew adjustment;

wherein said skew-adjusting portion has two kinds of transmission line segments comprising a convex transmission line segment including a differential trace pair composed of parallel traces having a spacing greater than a spacing of the non-skew-adjusting portion and a concave transmission line segment including a differential trace pair composed of parallel traces having a spacing smaller than the spacing of the non-skew-adjusting portion;

wherein a transmission line segment having a differential trace pair spacing identical to the differential trace pair spacing in the non-skew-adjusting portion is disposed between said convex transmission line segments;

wherein the transmission line segment having a differential trace pair spacing identical to the differential trace pair spacing in the non-skew-adjusting portion is disposed between said concave transmission line segments; and wherein in a case that a difference between the differential trace pair spacing of one kind of transmission line segment in said skew-adjusting portion and the differential trace pair spacing in said non-skew-adjusting portion is equal in absolute value to a difference between a differential trace pair spacing of the other kind of transmission line segment in said skew-adjusting portion and the differential trace pair spacing in said non-skew-adjusting portion, the following relation is satisfied:

$$0.5 \times \frac{x2}{x1} < \frac{Z - Z1}{Z2 - Z} < 1.5 \times \frac{x2}{x1}$$

where Z is a differential characteristic impedance of said non-skew-adjusting portion, x1 is a trace length of the concave transmission line segment, Z1 is a differential characteristic impedance of the concave transmission line segment, x2 is a trace length of the convex transmission line segment, and Z2 is a differential characteristic impedance of the convex transmission line segment.

* * * * *